(12) United States Patent
Ayyapureddi et al.

(10) Patent No.: US 10,949,284 B2
(45) Date of Patent: Mar. 16, 2021

(54) TECHNIQUES USING NONVOLATILE MEMORY AND VOLATILE MEMORY

(71) Applicant: Micron Technology, Inc., Boise, ID (US)

(72) Inventors: Sujeet V. Ayyapureddi, Boise, ID (US); Andrew F. Laforge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 16/204,089

(22) Filed: Nov. 29, 2018

(65) Prior Publication Data

US 2020/0174866 A1   Jun. 4, 2020

(51) Int. Cl.
| | | |
|---|---|---|
| G06F 11/00 | (2006.01) |
| G06F 11/07 | (2006.01) |
| G11C 11/4072 | (2006.01) |
| G11C 11/4074 | (2006.01) |
| G11C 17/16 | (2006.01) |
| H01L 27/112 | (2006.01) |
| G11C 11/4076 | (2006.01) |

(52) U.S. Cl.
CPC .......... *G06F 11/079* (2013.01); *G06F 11/073* (2013.01); *G06F 11/0754* (2013.01); *G11C 11/4072* (2013.01); *G11C 11/4074* (2013.01); *G11C 11/4076* (2013.01); *G11C 17/165* (2013.01); *H01L 27/11206* (2013.01); *G06F 2201/81* (2013.01)

(58) Field of Classification Search
CPC .......... G06F 2212/205; G06F 11/0754; G06F 11/079
See application file for complete search history.

(56) References Cited

U.S. PATENT DOCUMENTS

| | | | | |
|---|---|---|---|---|
| 5,862,314 A | * | 1/1999 | Jeddeloh | ................ G11C 29/70 714/6.13 |
| 5,974,564 A | * | 10/1999 | Jeddeloh | ................ G11C 29/76 714/6.13 |
| 6,545,899 B1 | * | 4/2003 | Derner | ..................... G11C 7/06 365/149 |

(Continued)

*Primary Examiner* — Jonathan D Gibson
(74) *Attorney, Agent, or Firm* — Holland & Hart LLP

(57) ABSTRACT

Devices and methods for using nonvolatile memory and volatile memory are described. As volatile memory cells may not retain information absent power, nonvolatile memory cells (e.g., antifuses, phase-change memory cells, ferroelectric memory cells) may store various information related to operating conditions of the volatile memory cells. For example, an operating condition (e.g., voltage, temperature, a timing parameter for command, or refresh rate) of volatile memory cells may exceed an operating limit causing the volatile memory cells to fail. An indication of the operating condition of the volatile memory cells may be stored in nonvolatile memory cells to be retrieved later. The indication stored in the nonvolatile memory cells may facilitate analytical processes to identify root-causes that may have caused the volatile memory cells to fail. Nonvolatile memory cells may be configured to indicate whether such an operating condition exists and provide specific information about the operating condition.

20 Claims, 10 Drawing Sheets

(56) References Cited

U.S. PATENT DOCUMENTS

| | | | |
|---|---|---|---|
| 7,385,837 B2* | 6/2008 | Perner | G11C 11/005 365/148 |
| 8,995,173 B1* | 3/2015 | Derhacobian | G11C 13/0011 365/149 |
| 2004/0015754 A1* | 1/2004 | Callaway | G11C 29/006 714/719 |
| 2006/0083050 A1* | 4/2006 | Perner | G11C 11/005 365/145 |
| 2010/0211853 A1* | 8/2010 | Madan | G11C 29/76 714/773 |
| 2010/0309709 A1* | 12/2010 | Shin | G11C 17/18 365/96 |
| 2014/0281661 A1* | 9/2014 | Milton | G06F 11/076 714/2 |
| 2016/0170643 A1* | 6/2016 | Katsurayama | G06F 3/0685 711/103 |
| 2018/0232173 A1* | 8/2018 | Chung | G06F 3/068 |
| 2019/0146914 A1* | 5/2019 | Rueger | G06F 12/08 711/103 |
| 2019/0188125 A1* | 6/2019 | Lin | G06F 3/0679 |

* cited by examiner

TECHNIQUES USING NONVOLATILE MEMORY AND VOLATILE MEMORY

BACKGROUND

The following relates generally to operating a memory device and more specifically to techniques using nonvolatile memory and volatile memory.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the electronic device may read, or sense, at least one stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source. Non-volatile memory, e.g., FeRAM, may maintain their stored logic state for extended periods of time even in the absence of an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states.

DETAILED DESCRIPTION

Figure 1:
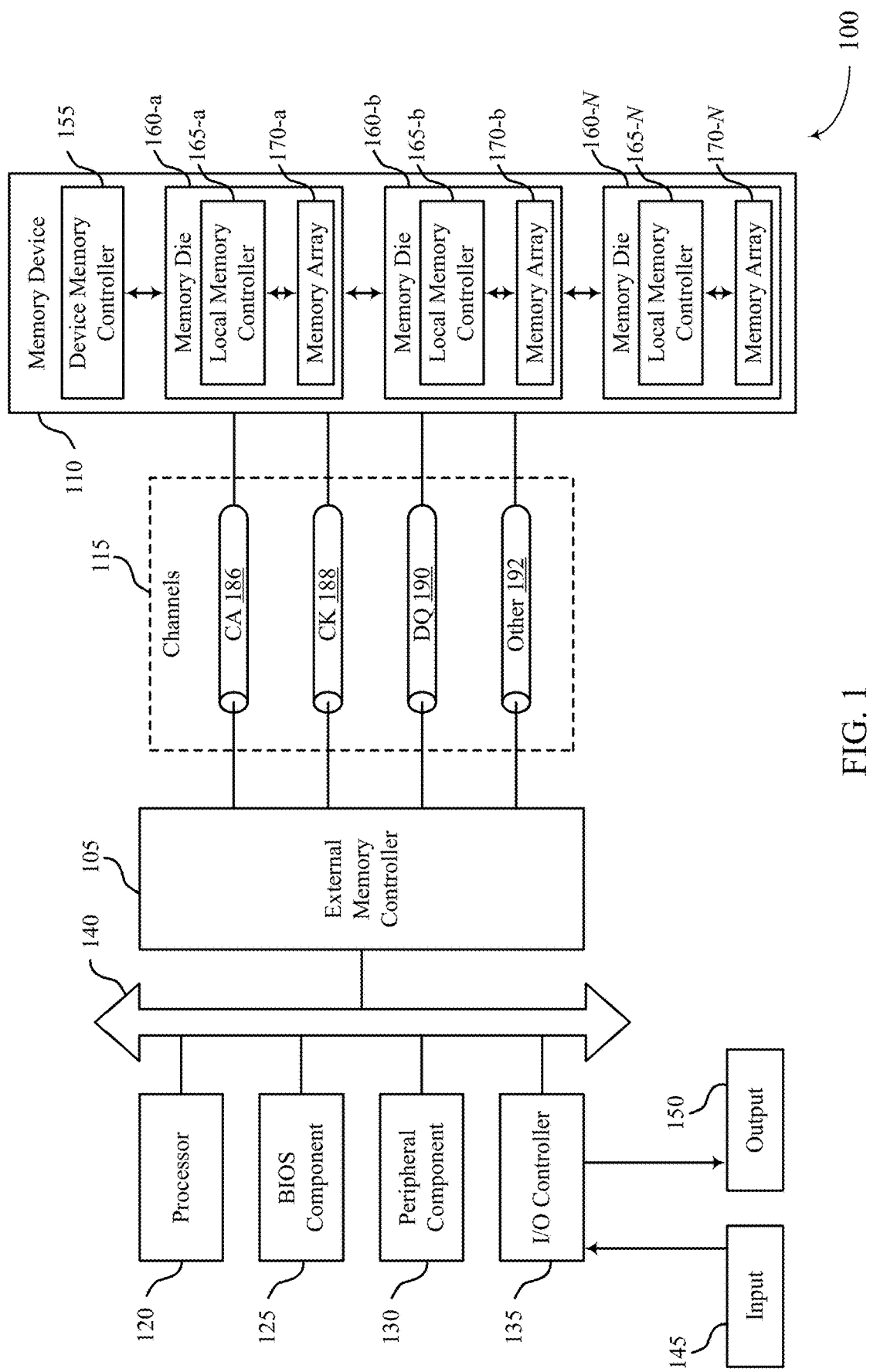
FIG. 1 illustrates an example of a system that supports techniques using nonvolatile memory and volatile memory in accordance with aspects of the present disclosure.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles) may be subject to harsh operating conditions. As such, memory devices (e.g., DRAM) for some applications may be manufactured using a process technology to provide an appropriate margin for a normal operation with respect to relatively tighter industry specifications (e.g., a higher operating temperature).

Performance of memory devices produced using a process technology, however, may be compromised due to, for example, slower clock speeds or lower memory capacity, when compared to memory devices produced using the state-of-the-art process technology. Understanding tolerable (or intolerable) operating conditions of state-of-the-art memory devices (e.g., DRAMs produced using the state-of-the-art process technology), as used in various electronic apparatuses (e.g., automotive applications) in some cases, may be beneficial to improve overall performance of the state-of-the-art memory devices.

Volatile memory cells (e.g., DRAM cells) of a memory device may lose their stored data absent an external power source periodically refreshing the data. Because memory devices that use volatile memory lose their stored data, it may be difficult to determine a cause of failure when the memory device fails in a user environment (e.g., an operating condition of a memory device as part of an electronic apparatus manufactured).

For example, a user may incorporate the memory device into a larger system or a host device. Sometimes that memory device may fail or not meet the standards of the user. In such examples, the user may return the memory device to the manufacturer to determine a cause of the failure. When the memory device is returned, volatile memory cells of the memory device may not contain any information about the user environment or what may have caused the failure. In some cases, users (e.g., manufacturers of electronic apparatuses that include memory devices) may violate limits of operating conditions established for a normal operation of the memory device (whether intentionally or inadvertently). In other cases, the memory device may have been operated under an extreme operating condition and that may be the cause of the failure of the memory device.

As volatile memory cells of a memory device may not retain data absent power, nonvolatile memory cells may be added to the memory device to store various information related to operations of or actions associated with the memory device (e.g., operations of volatile memory cells of the memory device). The data stored in the nonvolatile memory may be configured to store information to be used to diagnose causes for failures of the memory device (e.g., dynamically, at a later time). For example, an indication of an operating condition of volatile memory cells may be stored in nonvolatile memory cells such that the indication may be retrieved later should the memory device fail and be subject to analysis. Such indications retrieved from the nonvolatile memory cells may facilitate analytical processes to identify potential root-causes that may have contributed to or caused the memory device failure. In some cases, the non-volatile memory may be or include, but is not limited to, an array of antifuses.

Techniques for using nonvolatile memory and volatile memory are described. In some cases, a controller of a memory device may determine an operating condition of an array of volatile memory of the memory device and determine that the operating condition of the array of volatile memory satisfies a threshold of an operating limit of the memory device. The controller may determine that the operating condition satisfies the threshold for a duration and store an indication of the operating condition in an array of nonvolatile memory of the memory device based on determining that the operating condition satisfies the threshold for the duration. The array of nonvolatile memory may include an array of antifuses. In some cases, the array of nonvolatile memory may include phase-change memory cells or ferroelectric memory cells. In some cases, the controller of memory device may be a logic controller that is coupled with a logic layer associated with the array of nonvolatile memory. In some cases, such logic controller may be located in a same package as the array of volatile memory.

In some cases, a memory device may include an array of volatile memory and a circuit configured to determine an operating condition (e.g., an operating temperature, an operating voltage) of the array of volatile memory and determine that the operating condition of the array of volatile memory satisfies a threshold of an operating limit of the memory device. The memory device may also include another array of nonvolatile memory configured to store an indication that the operating condition of the array of volatile memory satisfies the threshold of the operating limit of the array of volatile memory using one or more nonvolatile memory cells (e.g., storage components). In some cases, both arrays of volatile memory and nonvolatile memory may be disposed on a single die.

In some cases, a memory device including a first array of volatile memory and a second array of nonvolatile memory may receive a reset command from a host device, where the reset command may be configured to erase information stored in the first array of volatile memory. Subsequently, the memory device (e.g., a local memory controller of the memory device) may identify that a process related to the first array of volatile memory may be currently being executed by the memory device and identify that the process has a higher priority than the reset command. In some cases, the process may be associated with accessing (e.g., storing data) the second array of nonvolatile memory that may be configured to store an indication of an operating condition of the first array of volatile memory. The memory device may complete the process (e.g., storing the indication of the operating condition at the second array of nonvolatile memory) before executing the reset command.

Features of the disclosure are initially described in the context of a memory device in an electronic system. Features of the disclosure are described in the context of a memory die and a block diagram that support techniques using nonvolatile memory and volatile memory in accordance with aspects of the present disclosure. These and other features of the disclosure are further illustrated by and described with reference to an apparatus diagram and flowcharts that relate to techniques using nonvolatile memory and volatile memory.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least some portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. In some cases, such commands may be associated with various timing parameters, such as row refresh timing (which may be referred to as $t_{RFC}$ timing), row to row delay (which may be referred to as $t_{RRD}$ timing), or the like. In some cases, such timing parameters may be specified in a product specification. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. In some examples, the memory device 110 or the memory die 160 may include a first array of volatile memory configured to store data using at least one volatile memory cell, a circuit configured to determine an operating condition of the first array of volatile memory and determine that the operating condition of the first array of volatile memory satisfies a threshold of an operating limit of the memory device, and a second array of nonvolatile memory configured to store an indication that the operating condition of the first array of volatile memory satisfies the threshold of the operating limit of the first array using one or more nonvolatile memory cells (e.g., storage components). In some cases, the memory device 110 or the memory die 160 may further include a circuit configured to determine that the operating condition satisfies the threshold for a duration.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105.

For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

In some examples, a memory device 110 or one or more of its components (e.g., device memory controller 155, the local memory controller 165) may receive from a host device (e.g., the external memory controller 105), a reset command configured to erase information stored in a first memory array 170 (e.g., an array of volatile memory). In some cases, the reset command may be configured to erase other information stored in the memory device 110 (e.g., latches, registers). Subsequently, the memory device 110 may identify that a process related to the first memory array 170 (e.g., the array of volatile memory) is currently being executed by the memory device 110 based on receiving the reset command and identify that the process has a higher priority than the reset command. The memory device 110 may execute the reset command after the process is complete based on identifying that the process has the higher priority than the reset command.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110.

For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data (DQ) channel 190 may be ×4 (e.g., including four signal paths), ×8 (e.g., including eight signal paths), ×16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal.

A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate (e.g., bi-directional) information to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
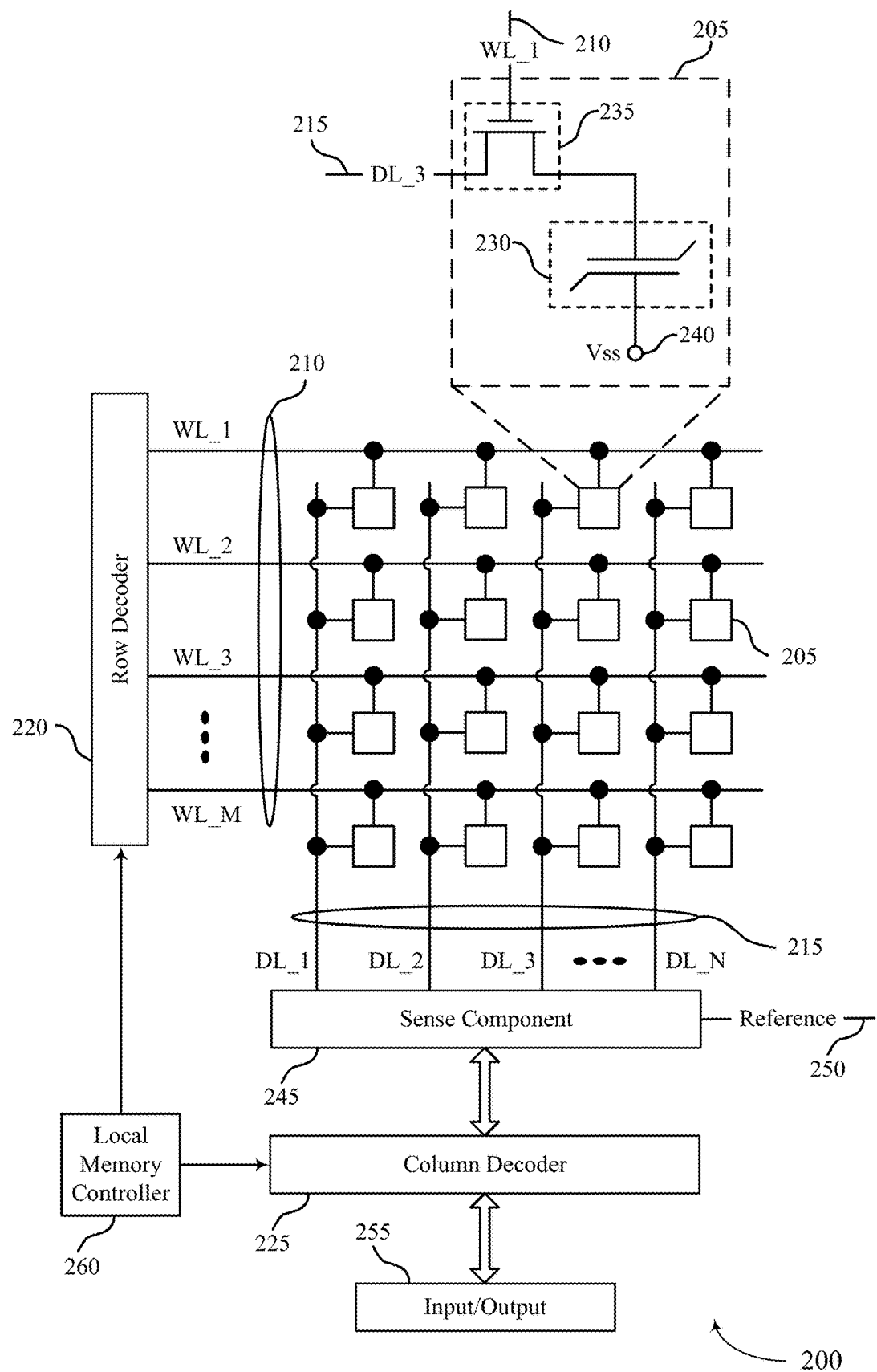
FIG. 2 illustrates an example of a memory die that supports techniques using nonvolatile memory and volatile memory in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. As used herein, a charge refers to an amount of charge present in or on a component or a conductor and is not limited to a particular value carried by a single proton or electron. DRAM architectures may include a capacitor (e.g., a capacitor 230) that includes a dielectric material to store a charge representative of the programmable state. In some examples, the memory cell 205 may be coupled with a sense component 245 via a digit line 215.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 and a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL 3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to the word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a charge stored on the capacitor 230 of the memory cell 205 and determine a logic state of the memory cell 205 based on the stored charge. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals.

The detected logic state of memory cell 205 may be output through column decoder 225 as output 255. In some cases, the sense component 245 may be part of another component (e.g., a column decoder 225, a row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260.

The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205).

The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205.

The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some cases, a memory device (e.g., a memory die 200) may include a first array of volatile memory configured to store data using at least one volatile memory cell (e.g., a memory cell 205) and a circuit configured to determine an operating condition of the first array of volatile memory and determine that the operating condition of the first array of volatile memory satisfies a threshold of an operating limit of the memory device. The memory device may also include a second array of nonvolatile memory configured to store an indication that the operating condition of the first array of volatile memory satisfies the threshold of the operating limit of the first array using one or more nonvolatile memory cells. In some cases, the first array of volatile memory and the second array of nonvolatile memory may be disposed on a single die, and the second array of nonvolatile memory may include an array of antifuses. In some cases, the circuit may include a logic controller of the memory device, the logic controller coupled with a logic layer associated with the second array of nonvolatile memory array. In some cases, the second array of nonvolatile memory may include an array of antifuses, an array of phase-change memory cells, or an array of ferroelectric memory cells, or a combination thereof.

Figure 3:
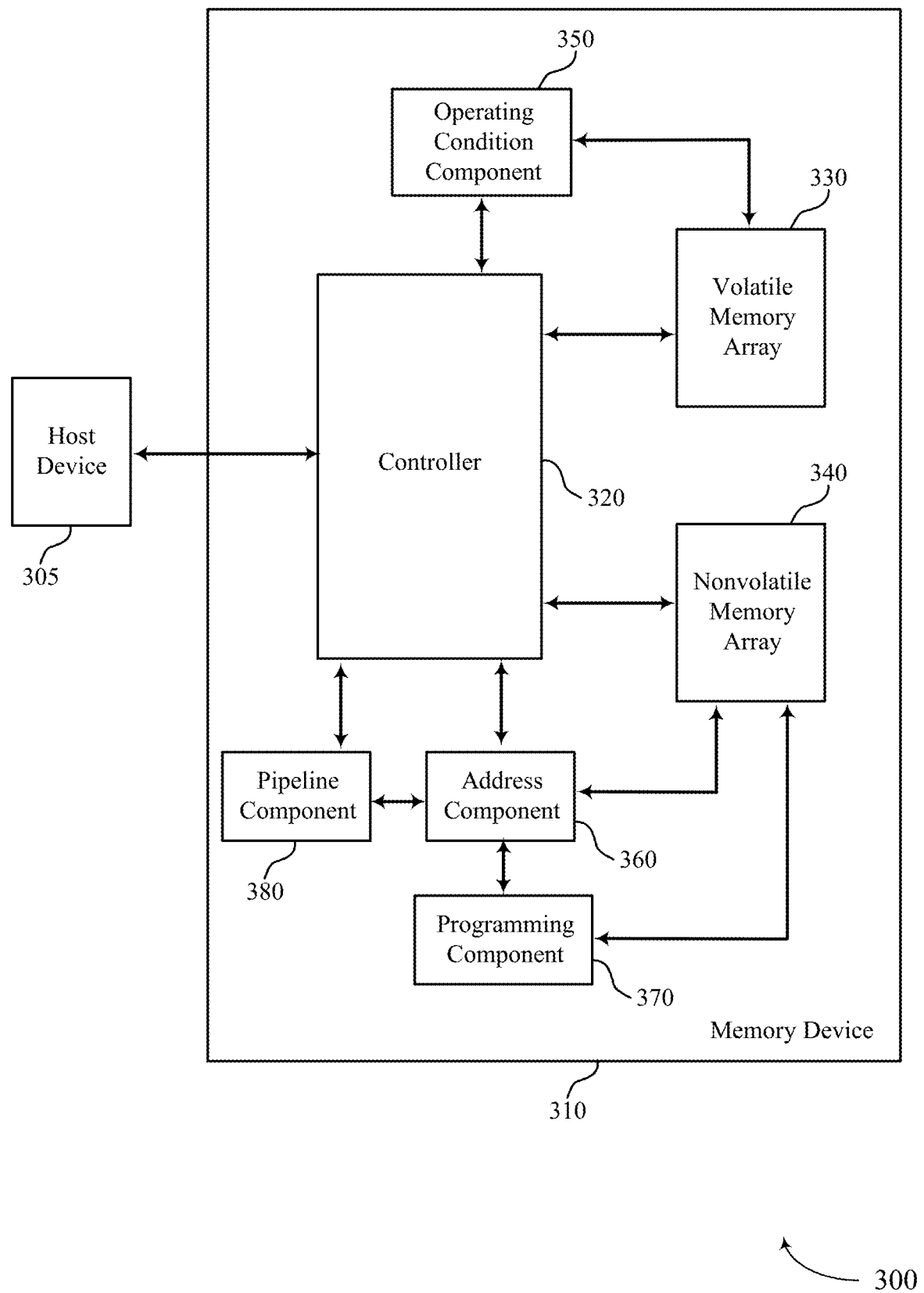
FIG. 3 illustrates an example of a system that supports techniques using nonvolatile memory and volatile memory in accordance with aspects of the present disclosure.

FIG. 3 illustrates an example of a system 300 that supports techniques using nonvolatile memory and volatile memory in accordance with aspects of the present disclosure. The system 300 may include one or more components described herein with reference to FIGS. 1 and 2. For example, the system 300 may include a host device 305, which may be an example of the external memory controller 105 as described with reference to FIG. 1; a memory device 310, which may be an example of the memory device 110, the memory dice 160, or the memory die 200 as described with reference to FIGS. 1 and 2; a controller 320, which may be an example of the device memory controller 155, the local memory controllers 165, the local memory controller 260 as described with reference to FIGS. 1 and 2; a volatile memory array 330, which may be an example of the memory arrays 170 as described with reference to FIG. 1. The memory device 310 may also include a nonvolatile memory array 340, an operating condition component 350, an address component 360, a programming component 370, and a pipeline component 380.

The nonvolatile memory array 340 may be configured to store information about an operating condition of the volatile memory array 330. In some cases, the nonvolatile memory array 340 may store information about when an operating condition of the volatile memory array 330 satisfies a threshold generally or may store information about when an operating condition of the volatile memory array 330 exceeds an operating limit defined by a specification of the volatile memory array 330.

The information stored by the nonvolatile memory array 340 may include an indication of an operating condition of the volatile memory array 330 when the operating condition satisfies a threshold of an operating limit of the memory device 310. The indication stored by the nonvolatile memory array 340 may include a set of descriptor bits configured to provide specific information about the operating condition and the threshold that is satisfied by the operating condition.

The indication stored by the nonvolatile memory array 340 may also include a flag bit that is configured to indicate that the threshold is satisfied for an operating condition. In some cases, the nonvolatile memory array 340 may include an array of antifuses, where each antifuse has a first conductivity after applying a programming voltage (e.g., a fuse blow voltage) that is greater than a second conductivity of the antifuse before applying the voltage. In some examples, an antifuse as manufactured (e.g., before applying a programming voltage) may be allocated with a logic state of 0 whereas an antifuse programmed (e.g., after applying the programming voltage) may be allocated with a logic state of 1.

The nonvolatile memory array 340 may be configured to communicate with the controller 320, the address component 360, the programming component 370, and the pipeline component 380. In some cases, the nonvolatile memory array 340 may include an array of phase-change memory cells, an array of ferroelectric memory cells, or an array of nonvolatile memory cells employing various nonvolatile memory technologies (e.g., MRAM, RRAM, flash memory). In some cases, the volatile memory array 330 and the nonvolatile memory array 340 may be positioned on a single die. In some cases, the controller 320 may be a logic controller and the volatile memory array 330 and the controller 320 may be positioned within a same package while the nonvolatile memory array 340 may be associated with a logic layer that may be coupled with the controller 320.

The operating condition component 350 may include a circuit configured to determine an operating condition of the volatile memory array 330 and determine that the operating condition of the volatile memory array 330 satisfies a threshold of an operating limit of the memory device 310. The controller 320 may, based on determining the operating condition satisfies the threshold, store an indication of the operating condition in the nonvolatile memory array 340. In some cases, the operating condition includes an operating voltage of the volatile memory array 330, an operating temperature of the volatile memory array 330, a timing parameter for a command directed to the volatile memory array 330, or a refresh rate of the volatile memory array 330, or a combination thereof.

In some cases, the circuit may include a temperature detection circuit and the operating condition may include an operating temperature of the volatile memory array 330. In some cases, the circuit may include a voltage detection circuit and the operating condition may include an operating voltage of the volatile memory array 330. For example, the operating condition component 350 may determine, using the voltage detection circuit, that an operating voltage of the volatile memory array 330 corresponds to 1.8 V that is greater than an operating limit established for the volatile memory array 330 (e.g., 1.2 V).

The operating condition component 350 may further determine that the operating condition satisfies the threshold for a duration. The controller 320 may, based on determining that the operating condition satisfies the threshold for the duration, store an indication of the operating condition in the nonvolatile memory array 340. In some cases, the duration may indicate whether the operating condition satisfying the threshold is intentional (e.g., a design of a user of the memory device 310 beyond an operating limit established for the memory device 310) or unintentional (e.g., accidental). For example, an operating voltage that satisfies a threshold (e.g., 1.8 V) for a brief duration (e.g., fractions of a micro-second) may be considered as unintentional (e.g., an accidental operating condition due to an unexpected electrical surge of an external power source). On the other hand, an operating voltage that satisfies a threshold (e.g., 1.8 V) for an extended duration (e.g., in the order of a few milliseconds) may be considered as intentional (e.g., an intended operating condition stemming from a design of a user).

The operating condition component 350 may detect a duration that the volatile memory array 330 operates in a certain mode of operation (e.g., a stand-by mode, a refresh mode, an idle mode, or an active mode) and determine that an operating condition of the volatile memory array 330 satisfies a threshold. Subsequently, the controller 320 may, based on detecting the duration that the volatile memory array 330 operates in the certain mode of operation, store an indication of the operating condition in the nonvolatile memory array 340. In some cases, a mode of operation associated with the memory device 310 (e.g., the volatile memory array 330) may be used to determine how the memory device 310 (e.g., the volatile memory array 330) may be used in a user's environment.

For example, a user may use the memory device 310 to manufacture a low-power memory system and provide the memory system with an operating voltage (e.g., 1.0 V) that is less than an operating limit established (e.g., 1.2 V) for the volatile memory array 330. As a result, the memory device 310 may fail—e.g., fail to support a certain data transfer rate required by the memory system. The operating condition component 350 may detect the operating voltage (e.g., 1.0 V) being less than the operating limit (e.g., 1.2 V) for the volatile memory array 330 such that the memory device 310 (e.g., the controller 320) may store an indication of the operating condition in the nonvolatile memory array 340—e.g., storing a flag bit to indicate that a threshold is satisfied for an operating condition and a set of descriptor bits to provide specific information about the operating condition, e.g., the operating voltage of 1.0 V.

In another example, a user may use the memory device 310 to manufacture a numerical control system for an automotive application. Sometimes an operating temperature of the numerical control system in a vehicle may reach a temperature (e.g., 125 degree Celsius) that is greater than an operating limit established (e.g., 110 degree Celsius) for the volatile memory array 330. As a result, the memory device 310 may fail—e.g., fail to produce reliable data, in some cases, due to an inadequate refresh rate at the operating temperature (e.g., tRFC timing established below the operating limit of 110 degree Celsius may not be adequate at the operating temperature).

The operating condition component 350 may detect the operating temperature (e.g., 125 degree Celsius) being greater than the operating limit (e.g., 110 degree Celsius) for the volatile memory array 330 such that the memory device 310 (e.g., the controller 320) may store an indication of the operating condition in the nonvolatile memory array 340—e.g., storing a flag bit to indicate that a threshold is satisfied for an operating condition and a set of descriptor bits to provide specific information about the operating condition, e.g., the operating temperature of 125 degree Celsius.

In yet another example, the operating condition component 350 may detect a violation of a timing parameter associated with a certain command (e.g., write command, read command, refresh command). In some cases, the operating condition component 350 may include a timer that counts a number of clock cycles associated with such command. As an example, a user may issue a read command in violation of $t_{RRD}$ timing (row to row delay timing associated with a certain time duration (e.g., an amount of clock cycles) to properly activate a next bank of memory cells), which may result in one or more errors in reading data from the next bank of memory cells. The operating condition component 350 may communicate with the controller 320 of such violations of timing parameters such that the violations may be recorded in the nonvolatile memory 340 as described herein.

The address component 360 may be configured to identify an address of a storage component of the nonvolatile memory array 340 to store an indication of an operating condition of the volatile memory array 330 that satisfies a threshold. The controller 320 may store the indication of the operating condition based on identifying the address of the storage component of the nonvolatile memory array 340. Subsequently, the controller 320 may increment the address of the storage component that is stored in the address component 360.

In some cases, the controller 320 may perform an initialization procedure for the memory device 310 (e.g., during power-on event, upon receiving a reset command from a host device) and identify a last known address for storing indications of operating conditions in the nonvolatile memory array 340. Subsequently, the controller 320 may identify an address of a storage component of the nonvolatile memory array 340 based on performing the initialization procedure. In some cases, the address component 360 may store the last known address such that an address of a storage component of the nonvolatile memory array 340 may be identified such that an indication of an operating condition of the volatile memory array 330 may be stored at the nonvolatile memory array 340.

The programming component 370 may be configured to store an indication of an operating condition of the volatile memory array 330 at the nonvolatile memory array 340. In some cases, the programming component 370 may receive an address of a storage component of the nonvolatile memory array 340 from the address component 360. In some cases, the nonvolatile memory array 340 may include an array of antifuses and the programming component 370 may identify a particular antifuse based on the address received from the address component 360 such that the programming component 370 may apply a voltage to the particular antifuse to store at least a portion of the indication of the operating condition.

In some cases, the particular antifuse may, after receiving the voltage, have a greater conductivity than before receiving the voltage. In some examples, the greater conductivity of an antifuse may be attributed to a permanent breakdown of a gate oxide of a metal-oxide-semiconductor field-effect transistor (MOSFET) after receiving the voltage across the gate oxide. In other examples, the greater conductivity of an antifuse may be attributed to a permanent breakdown of an oxide of a capacitor after receiving the voltage across the oxide. In some cases, the antifuses having a greater conductivity after receiving the voltage may be referred to as blown antifuses.

In some cases, the pipeline component 380 may be configured to store information about the nonvolatile memory array 340. In the context of computing, a pipeline may refer to a set of data processing components connected in series, where an output of one component is an input of the next component. The pipeline component 380 may be an asynchronous pipeline that may operate based on a handshake signal between data processing components instead of a clock signal as in a synchronous pipeline. In some examples, the pipeline component 380 may be part of the address component 360. In some examples, the pipeline component 380 may operate in conjunction with the address component 360.

In some cases, when the memory device 310 is powered-up, the pipeline component 380 may be loaded with information about the nonvolatile memory array 340 based on the controller 320 reading the information about the nonvolatile memory array 340. The information about the nonvolatile memory array 340 (e.g., an array of antifuses) may include a first quantity of storage components programmed (e.g., a first quantity of blown antifuses represented as a logic state of 1), a last known address of the storage component programmed (e.g., a last known address of a blown antifuse), a second quantity of storage components available (e.g., a second quantity of available antifuses represented as a logic state of 0).

For example, when a memory device (e.g., memory device 310) is returned from a user due to a failure associated with the memory device, the memory device may be powered-up and the pipeline component 380 may be loaded with information about the nonvolatile memory array 340 (e.g., an array of antifuses). When the pipeline component 380 includes a first quantity of bits (e.g., five bits) corresponding to a logic state of 1 (e.g., blown antifuses), it may be construed that the first quantity of specific incidents (e.g., operating conditions satisfying thresholds of operating limits) may have occurred for the memory device in a user environment. On the other hand, when the pipeline component 380 includes no bits corresponding to a logic state of 1, it may be construed that the memory device 310 did not experience any such incidents in a user environment.

Figure 4:
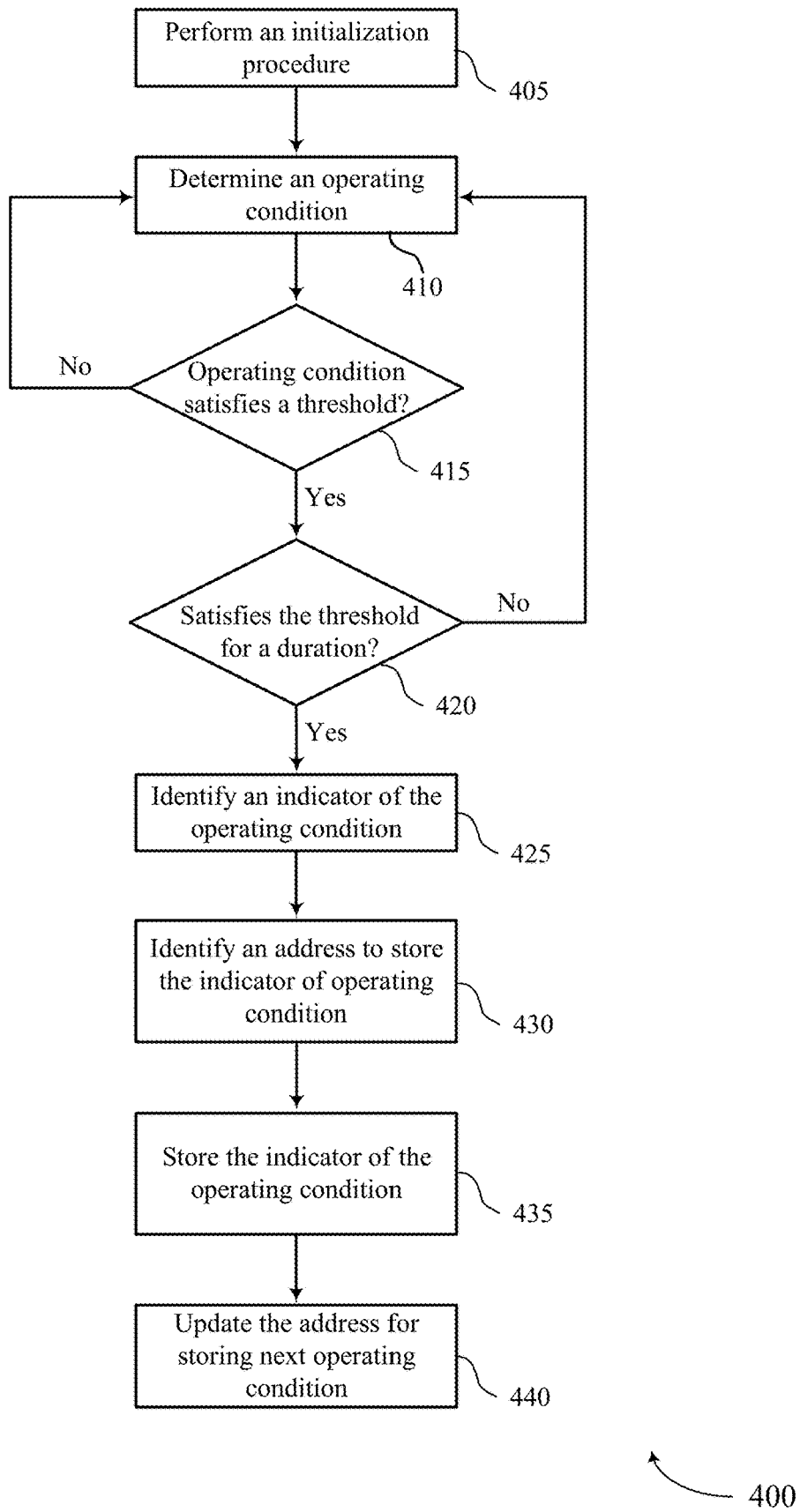
FIG. 4 shows an example diagram of a process flow that support techniques using nonvolatile memory and volatile memory in accordance with aspects of the present disclosure.

FIG. 4 shows an example diagram of a process flow 400 that supports techniques using nonvolatile memory and volatile memory in accordance with aspects of the present disclosure. The features of process flow 400 may be implemented or performed by a memory device (e.g., the memory device 110, the memory dice 160, the memory die 200, the memory device 310 described with reference to FIGS. 1 through 3) or a component of a memory device such as the device memory controller 155, the local memory controllers 165, the local memory controller 260, the controller 320 as described with reference to FIGS. 1 through 3.

At block 405, the controller 320 may perform an initialization procedure. The controller 320 may, in some cases, perform the initialization procedure upon a power-up event for a memory device (e.g., the memory device 310) or upon receiving a reset command from a host device. In some cases, the controller 320 may extract information about a second array of nonvolatile memory (e.g., the nonvolatile memory array 340) and load the information to an address component (e.g., the address component 360, the pipeline component 380). In some cases, the controller 320 may identify a last known address for storing indications of operating conditions in the nonvolatile memory (e.g., the nonvolatile memory array 340).

At block 410, the controller 320, using the operating condition component 350, may determine an operating condition of a first array of volatile memory (e.g., the volatile memory array 330) of the memory device. In some cases, the operating condition includes an operating voltage of the first array of volatile memory, an operating temperature of the first array of volatile memory, a timing parameter for a command directed to the first array of volatile memory, or a refresh rate of the first array of volatile memory, or a combination thereof. In some cases, the operation condition includes a mode of operation of the first array of volatile memory such as a stand-by mode, a refresh mode, an idle mode, or an active mode, or a combination thereof.

At block 415, the controller 320 may determine whether the operating condition of the first array of volatile memory (e.g., the volatile memory array 330) satisfies a threshold. In some cases, the threshold may represent an operating limit of the memory device. For example, an operating temperature of the volatile memory array 330 may be 125 degree Celsius whereas an operating temperature limit of the memory device is 110 degree Celsius. In such examples, the threshold may be the operating temperature limit (e.g., 110 degree Celsius). In another example, an operating voltage of the volatile memory array 330 may be 0.6 V whereas a low limit of operating voltage of the memory device is 0.8 V. When the controller determines that the operating condition of the first array of volatile memory satisfies the threshold of the operating limit of the memory device, the controller may proceed to block 420. Alternatively, when the controller determines that the operating condition of the first array of volatile memory does not satisfy the threshold of the operating limit of the memory device, the controller may continue monitoring one or more operating conditions of the first array of volatile memory—e.g., at block 410, monitor a refresh rate of the first array of volatile memory.

At block 420, the controller 320 may determine whether the operating condition satisfies the threshold for a duration. As described herein, the duration may indicate whether the operating condition satisfying the threshold is intentional (e.g., a user design using the memory device 310 beyond an operating limit established for the memory device 310, for example at 0.6 V instead of the low limit of 0.8 V) or unintentional (e.g., accidental). When the controller determines that the operating condition of the first array of volatile memory satisfies the threshold for the duration, the controller may proceed to block 425. Alternatively, when the controller determines that the operating condition of the first array of volatile memory does not satisfy the threshold for the duration, the controller may continue monitoring the one or more operating conditions of the first array of volatile memory.

At block 425, the controller 320 may identify a plurality of descriptor bits configured to provide specific information about the operating condition and the threshold that is satisfied by the operating condition. For example, the plurality of descriptor bits may include four-bits to provide specific information about the operating condition—e.g., 1010 indicating an operating voltage of 0.6 V that is less than the low limit of 0.8 V, 0010 indicating an operating temperature of 125 degree Celsius that is greater than the high limit of 110 degree Celsius, and the like. In some cases, the plurality of descriptor bits may include a different quantity of bits than four (e.g., two, three, five, six, seven, eight). In some cases, the controller 320 may refer to a look-up table that defines correspondences between the plurality of descriptor bits and a specific operating condition. For example, the four-bit descriptor bits may describe sixteen (16) different operating conditions. Further, the indication of the operating condition may include a flag bit to indicate that the threshold is satisfied for the operating condition.

At block 430, the controller 320 may identify, using an address component (e.g., the address component 360, the pipeline component 380), an address of a storage component of the second array of nonvolatile memory (e.g., the nonvolatile memory array 340) to store the indication (e.g., the plurality of descriptor bits, the flag bit). In some cases, the controller 320 may identify the address of a storage component based on performing the initialization procedure that identifies a last known address for storing indications of operating conditions.

At block 435, the controller 320 may store an indication of the operating condition in a second array of nonvolatile memory (e.g., the nonvolatile memory array 340) of the memory device. The indication of the operation condition may include the plurality of descriptor bits identified at block 425. The indication of the operation condition may further include the flag bit indicating that the threshold is satisfied for the operating condition. In some cases, the second array of nonvolatile memory may include an array of antifuses. Storing the indication of the operating condition in the second array of nonvolatile memory may include the controller 320 applying, using a programming component (e.g., the programming component 370), a voltage to an antifuse to store at least a portion of the indication of the operating condition.

At block 440, the controller 320 may increment the address of the storage component stored in the address component (e.g., the address component 360) after storing the indication in the second array (e.g., the nonvolatile memory array 340).

Figure 5:
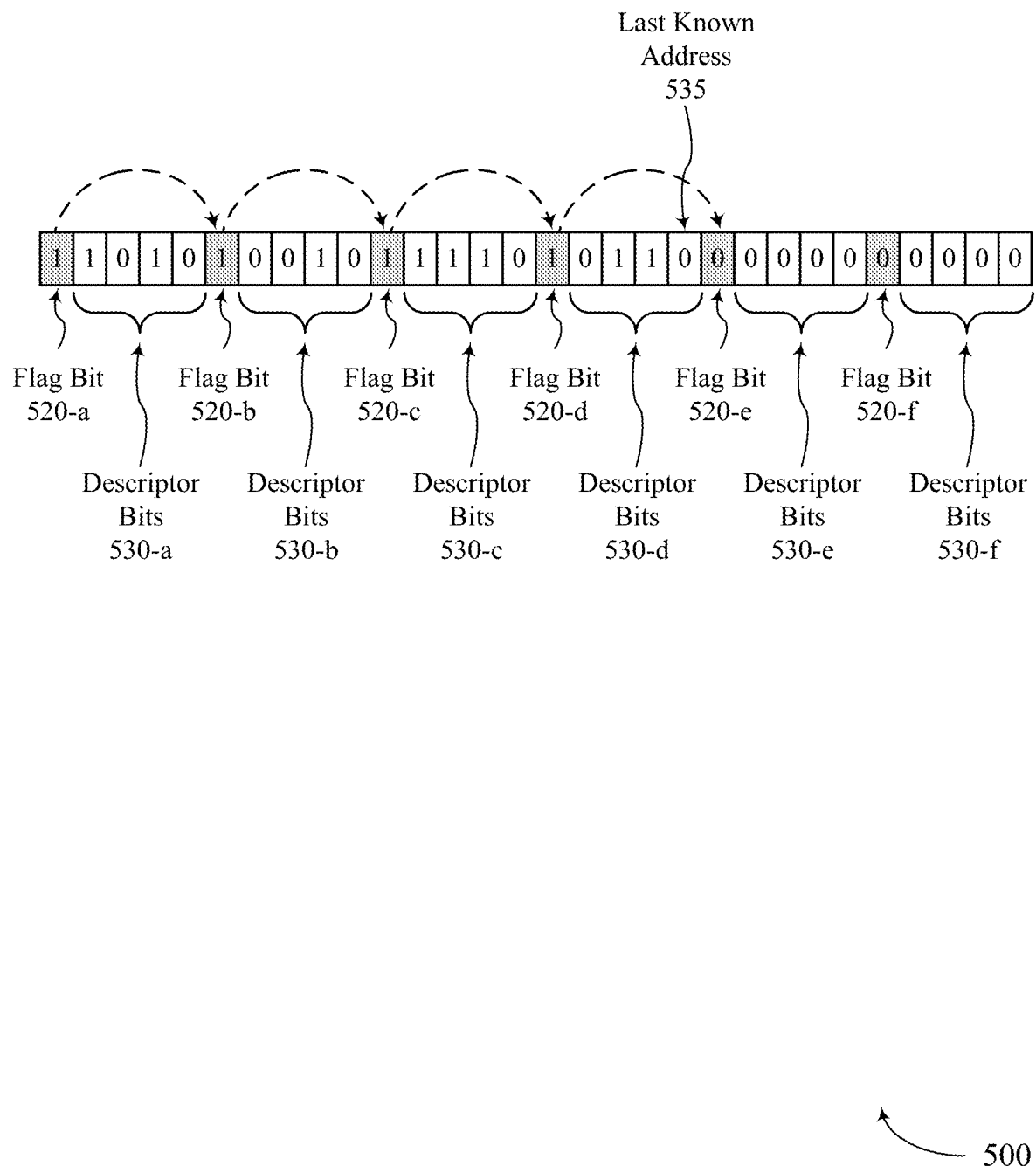
FIG. 5 illustrates an example of a memory configuration that supports techniques using nonvolatile memory and volatile memory in accordance with aspects of the present disclosure.

FIG. 5 illustrates an example of a memory configuration 500 that supports techniques using nonvolatile memory and volatile memory in accordance with aspects of the present disclosure. The memory configuration 500 illustrates how storage components may be arranged in the nonvolatile memory array 340. In some cases, the nonvolatile memory array 340 may include an array of antifuses, an array of phase-change memory cells, or an array of ferroelectric memory cells, or a combination thereof. As such, each storage component may represent a bit of data. In some cases, each storage component may be an example of an antifuse, a phase-change memory cell, or a ferroelectric memory cell.

As described herein, the nonvolatile memory array 340 may be configured to store an indication that an operating condition of a first array of volatile memory (e.g., the volatile memory array 330) satisfies the threshold of the operating limit of the first array using one or more nonvolatile memory cells. An indication of an operating condition may include a flag bit (e.g., flag bit 520-a). When a flag bit is programmed with a logic state of 1 (e.g., a blown antifuse), the flag bit (e.g., flag bit 520-a) indicates that a threshold for the operating condition is satisfied. The indication of the operating condition may further include a plurality of descriptor bits (e.g., descriptor bits 530-a) associated with the flag bit (e.g., the flag bit 520-a). For example, four-bits of the descriptor bits 530-a may be programmed with 1010 that provides specific information about the operating condition (e.g., 1010 corresponds to an operating voltage of 0.6 V that is less than the low limit of 0.8 V).

When the controller 320 determines that an operating condition satisfies a threshold, a next flag bit (e.g., flag bit 520-b) may be programmed (e.g., blown antifuse with a logic state of 1). In addition, a next set of descriptor bits (e.g., descriptor bits 530-b) may be programmed with 0010 to provide specific information about the operating condition that satisfied the threshold (e.g., 0010 corresponds to an operating temperature of 125 degree Celsius that is greater than the high limit of 110 degree Celsius). As such, the nonvolatile memory array 340 may store a set of indications of operating conditions that satisfies various thresholds of operating limits.

In some cases, the controller 320 may retrieve information about the nonvolatile memory array 340 during a power-up event for the memory device or upon executing a reset command from a host device. The controller 320 may load the information to an address component (e.g., the address component 360, the pipeline component 380). Subsequently, the controller 320 may access (e.g., read, walk down) a set of flag bits as denoted by dotted lines. When the controller 320 reads 1 from a flag bit (e.g., flag bit 520-*a*), the controller 320 may read associated descriptor bits (e.g., descriptor bits 530-*a*) to provide specific information about the operating condition that satisfied the threshold (e.g., 1010 corresponds to an operating voltage of 0.6 V that is less than the low limit of 0.8 V). As such, the controller 320 may determine a first quantity of incidents associated with operating conditions satisfying thresholds by accessing the flag bits. The controller 320 may also determine a second quantity of available storage components by assessing flag bits when the nonvolatile memory array 340 is configured with a fixed total quantity of storage components.

Similarly, when the controller 320 reads 0 (e.g., available antifuse, unblown antifuse) from a flag bit (e.g., flag bit 520-*e*), the controller 320 may determine that there is no additional information about the operating conditions and may stop accessing the nonvolatile memory array 340. Hence, the controller 320 may not read descriptor bits (e.g., descriptor bits 530-*e*) associated with the flag bit with a logic state 0 (e.g., flag bit 520-*e*). As such, the controller 320 may determine the last known address for storing indications of operating conditions in the second array of nonvolatile memory (e.g., last known address 535) and identify an address of a storage component to store a next indication of operating condition (e.g., an address corresponding to the flag bit 520-*e*).

Figure 6:
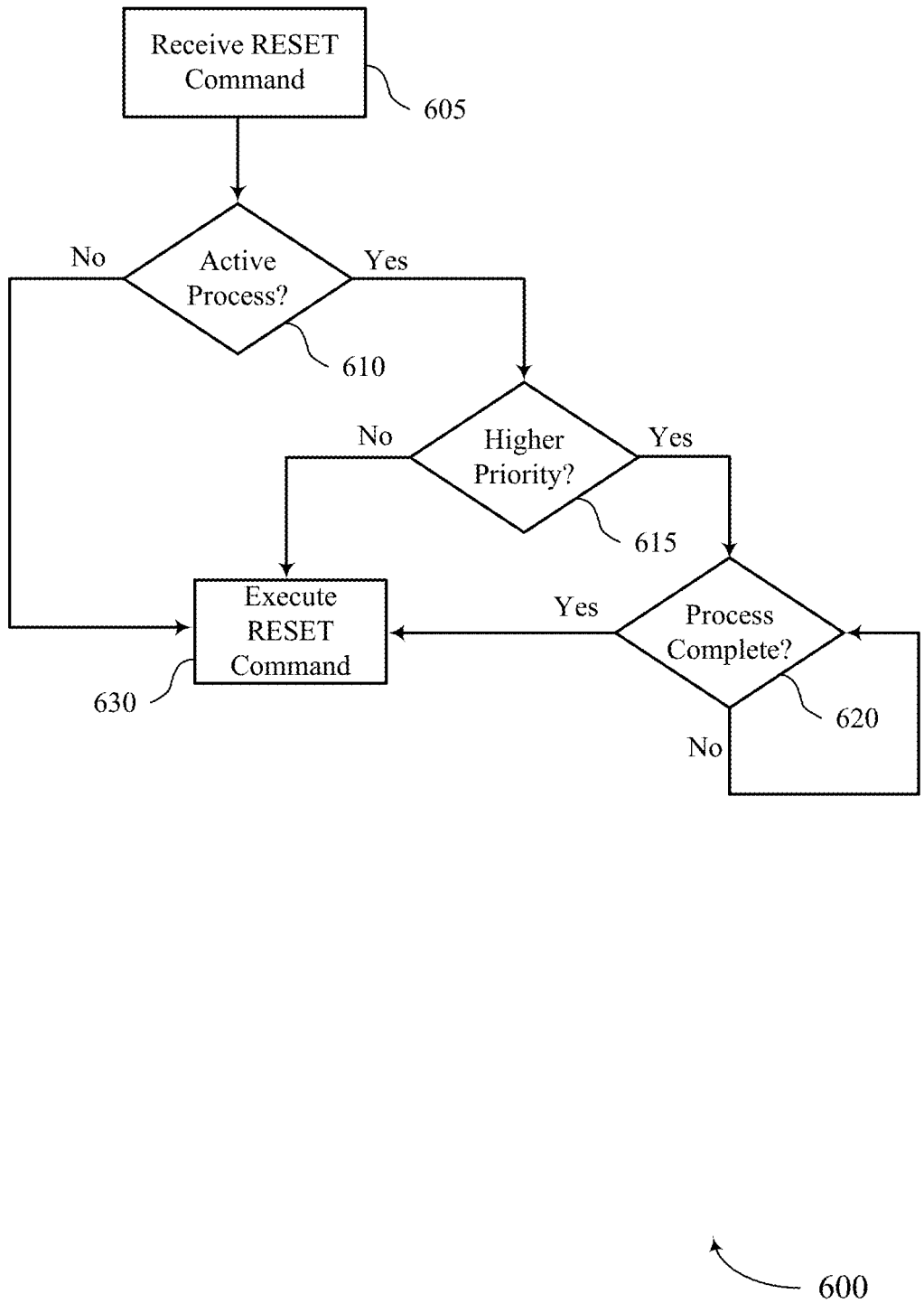
FIG. 6 shows an example diagram of a process flow that support techniques using nonvolatile memory and volatile memory in accordance with aspects of the present disclosure.

FIG. 6 shows an example diagram of a process flow 600 that supports techniques using nonvolatile memory and volatile memory in accordance with aspects of the present disclosure. The features of process flow 600 may be implemented or performed by a memory device (e.g., the memory device 110, the memory dice 160, the memory die 200, the memory device 310 described with reference to FIGS. 1 through 3) or a component of a memory device such as the device memory controller 155, the local memory controllers 165, the local memory controller 260, the controller 320 as described with reference to FIGS. 1 through 3.

At block 605, the controller 320 may receive, from a host device (e.g., the external memory controller 105 described with reference to FIG. 1), a reset command configured to erase information stored in a first array of volatile memory (e.g., the volatile memory array 330) in the memory device. In some cases, the host device may transmit the reset command when the memory device is stalled.

At block 610, the controller 320 may identify that a process related to the first array of volatile memory is currently being executed by the memory device based on receiving the reset command. In some cases, the process may access a second array of nonvolatile memory (e.g., the nonvolatile memory array 340) of the memory device, where the second array of nonvolatile memory may be configured to store an indication of an operating condition of the first array of volatile memory. For example, the memory device (e.g., the controller 320) may be storing the indication of the operating condition at the second array of nonvolatile memory when the reset command is received. The controller 320 may proceed to block 615 based on identifying the process. Alternatively, if there is no process identified, then the controller 320 may proceed to block 630 to execute the reset command.

At block 615, the controller 320 may identify that the process has a higher priority than the reset command. For example, the controller 320 may identify that storing the indication of the operating condition in an array of nonvolatile memory has a higher priority than the reset command. The controller 320 may proceed to block 620 based on identifying the process having the higher priority than the reset command. Alternatively, if the process has a lower priority than the reset command, then the controller 320 may proceed to block 630 to execute the reset command.

At block 620, the controller 320 may determine whether the process (e.g., the processing with the higher priority than the reset command) is complete. If the process is not completed, then the controller 320 may wait until the process is complete. When the process is complete, the controller 320 may proceed to block 630 and execute the reset command.

Figure 7:
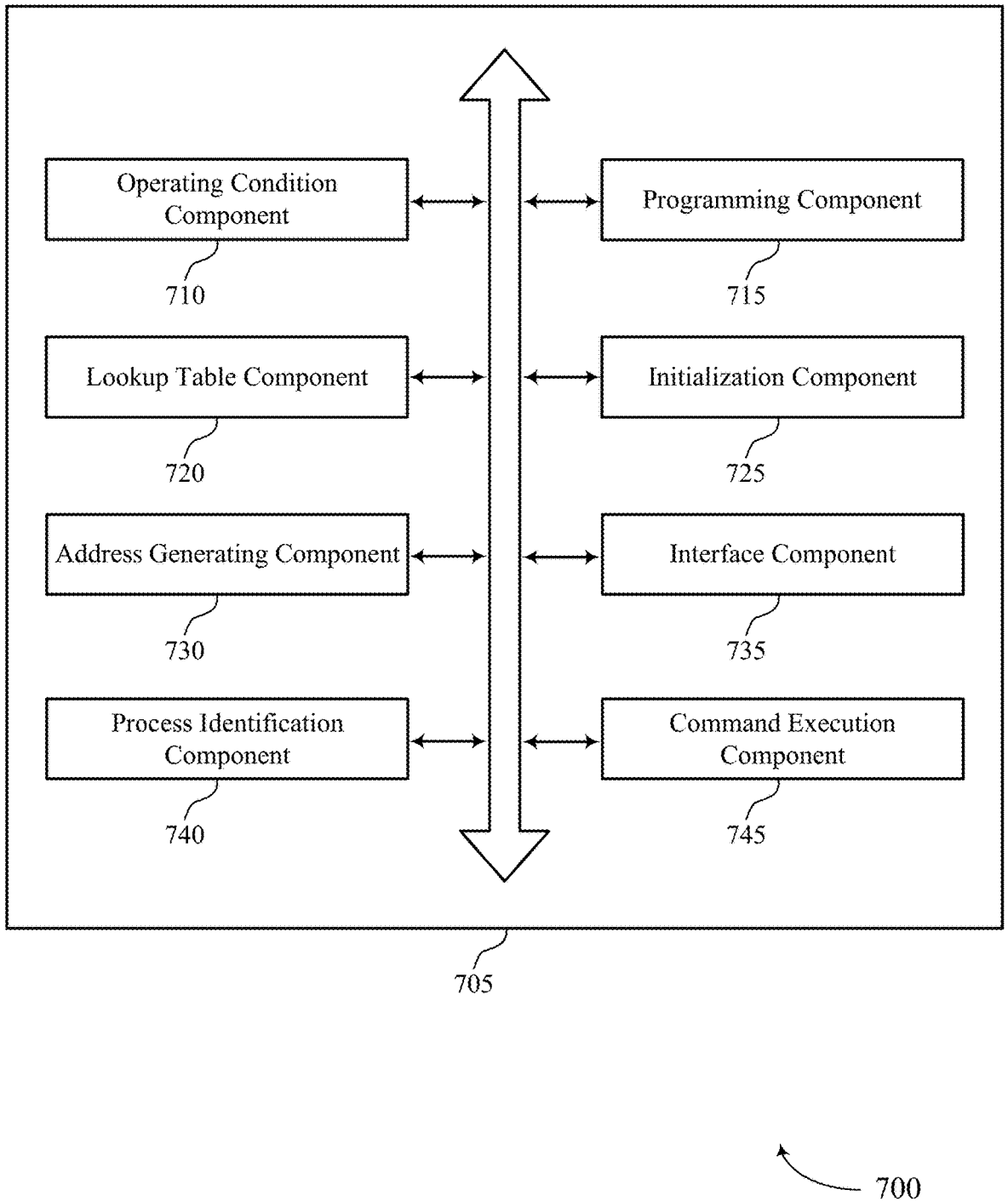
FIG. 7 shows an example of a device that supports techniques using nonvolatile memory and volatile memory in accordance with aspects of the present disclosure.

FIG. 7 shows an example of a diagram 700 of a device 705 that supports techniques using nonvolatile memory and volatile memory in accordance with aspects of the present disclosure. The device 705 may be an example of aspects of a controller (e.g., the device memory controller 155, the local memory controller 165, the local memory controller 260, the controller 320, as described with reference to FIGS. 1 through 3). The device 505 may include an operating condition component 710, a programming component 715, a lookup table component 720, an initialization component 725, an address generating component 730, an interface component 735, a process identification component 740, and a command execution component 745. Each of these components may communicate, directly or indirectly, with one another (e.g., via one or more buses).

The operating condition component 710 may determine an operating condition of a first array of volatile memory of a memory device. In some cases, the operating condition component 710 may determine that the operating condition of the first array of volatile memory satisfies a threshold of an operating limit of the memory device. In some cases, the operating condition component 710 may determine that the operating condition satisfies the threshold for a duration, where storing the indication is based on the operating condition satisfying the threshold for the duration. In some cases, the operating condition component 710 may detect a duration that the first array of volatile memory operates in a mode, where determining that the operating condition satisfies the threshold is based on detecting the duration that the first array operates in the mode.

The programming component 715 may store an indication of the operating condition in a second array of nonvolatile memory of the memory device based on determining that the operating condition satisfies the threshold, the second array of nonvolatile memory including an array of antifuses. In some cases, the programming component 715 may store a plurality of descriptor bits in the second array of nonvolatile memory. In some cases, the programming component 715 may store a flag bit in the second array of nonvolatile memory to indicate that the threshold is satisfied based on determining that the operating condition satisfies the threshold, where the indication of the operating condition includes the flag bit. In some cases, the programming component 715 may apply a voltage to an antifuse to store at least a portion of the indication of the operating condition, where storing the indication of the operating condition in the second array of nonvolatile memory is based on applying the voltage to the antifuse.

The lookup table component 720 may identify a plurality of descriptor bits configured to provide specific information about the operating condition and the threshold that is satisfied by the operating condition.

The initialization component 725 may perform an initialization procedure that identifies a last known address for storing indications of operating conditions in the second array of nonvolatile memory.

The address generating component 730 may identify, using an address component, an address of a storage component of the second array of nonvolatile memory to store the indication, where storing the indication of the operating condition is based on identifying the address of the storage component. In some cases, the address generating component 730 may increment the address of the storage component stored in the address component after storing the indication in the second array. In some cases, the address generating component 730 may identify an address of a storage component of the second array of nonvolatile memory based on performing the initialization procedure.

The interface component 735 may receive, by a memory device from a host device, a reset command configured to erase information stored in a first array of volatile memory in the memory device.

The process identification component 740 may identify that a process related to the first array of volatile memory is currently being executed by the memory device based on receiving the reset command. In some cases, the process identification component 740 may identify that the process has a higher priority than the reset command.

The command execution component 745 may execute the reset command after the process is complete based on identifying that the process has the higher priority than the reset command.

Figure 8:
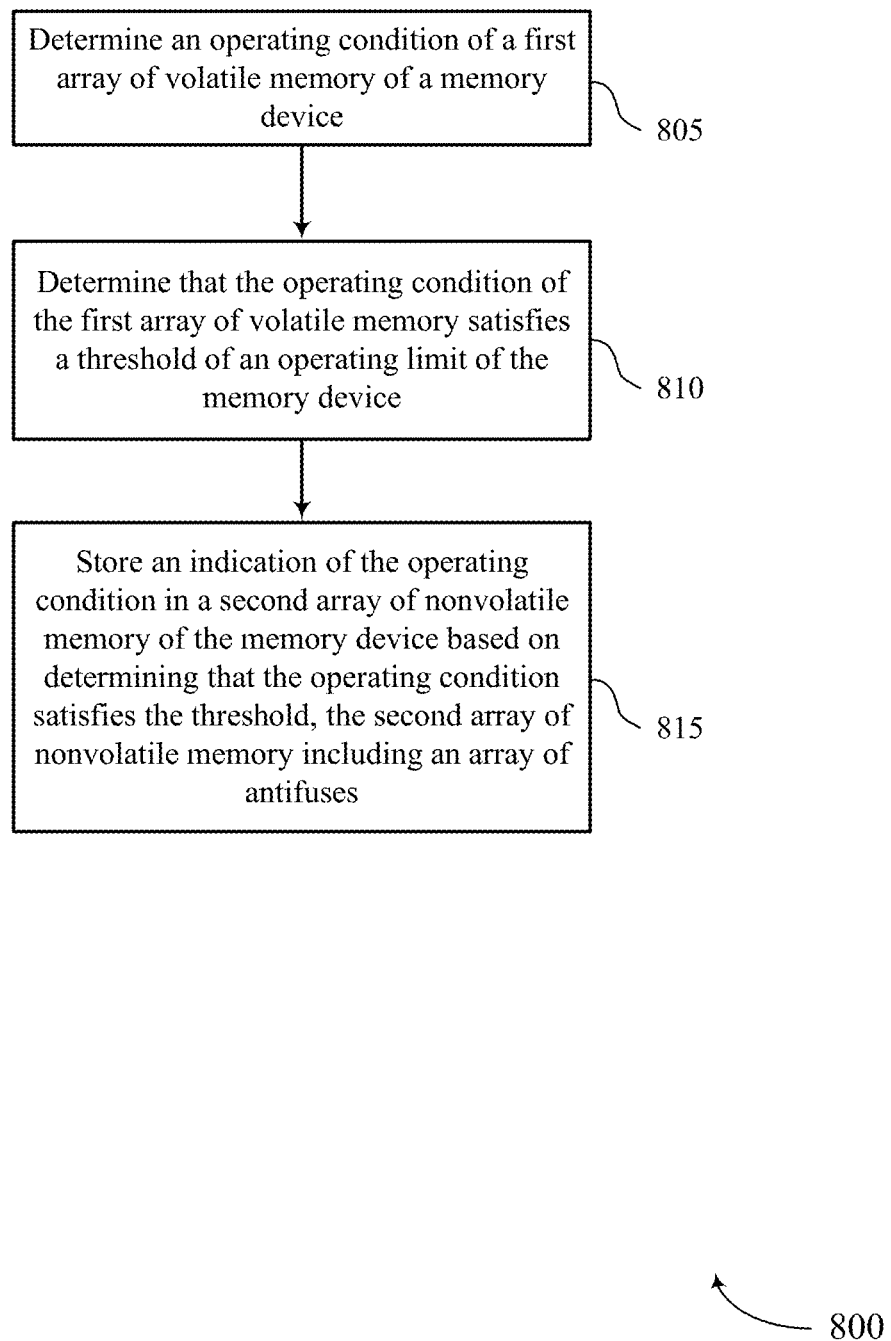
FIGS. 8 through 10 show flowcharts illustrating a method or methods that support techniques using nonvolatile memory and volatile memory in accordance with aspects of the present disclosure.

FIG. 8 shows a flowchart illustrating a method 800 that supports techniques using nonvolatile memory and volatile memory in accordance with aspects of the present disclosure. The operations of method 800 may be implemented by a controller or its components as described herein. For example, the operations of method 800 may be performed by a controller (e.g., the device memory controller 155, the local memory controller 165, the local memory controller 260, the controller 320, as described with reference to FIGS. 1 through 3). In some examples, a controller may execute a set of instructions to control the functional elements of the memory array to perform the functions described below. Additionally or alternatively, a controller may perform aspects of the functions described below using special-purpose hardware.

At 805 the controller may determine an operating condition of a first array of volatile memory of a memory device. The operations of 805 may be performed according to the methods described herein. In some examples, aspects of the operations of 805 may be performed by the operating condition component 710 as described with reference to FIG. 7.

At 810 the controller may determine that the operating condition of the first array of volatile memory satisfies a threshold of an operating limit of the memory device. The operations of 810 may be performed according to the methods described herein. In some examples, aspects of the operations of 810 may be performed by the operating condition component 710 as described with reference to FIG. 7.

At 815 the controller may store an indication of the operating condition in a second array of nonvolatile memory of the memory device based on determining that the operating condition satisfies the threshold, the second array of nonvolatile memory including an array of antifuses. The operations of 815 may be performed according to the methods described herein. In some examples, aspects of the operations of 815 may be performed by the programming component 715 as described with reference to FIG. 7.

An apparatus for performing a method or methods, such as the method 800, is described. The apparatus may include means for determining an operating condition of a first array of volatile memory of a memory device, means for determining that the operating condition of the first array of volatile memory satisfies a threshold of an operating limit of the memory device, and means for storing an indication of the operating condition in a second array of nonvolatile memory of the memory device based on determining that the operating condition satisfies the threshold, the second array of nonvolatile memory including an array of antifuses.

Another apparatus for performing a method or methods, such as the method 800, is described. The apparatus may include one or more memory arrays and a local memory controller in electronic communication with the one or more memory arrays, where the local memory controller may be operable to determine an operating condition of a first array of volatile memory of a memory device, determine that the operating condition of the first array of volatile memory satisfies a threshold of an operating limit of the memory device, and store an indication of the operating condition in a second array of nonvolatile memory of the memory device based on determining that the operating condition satisfies the threshold, the second array of nonvolatile memory including an array of antifuses.

Some examples of the method 800 and apparatuses described herein may further include processes, features, means, or instructions for identifying a plurality of descriptor bits configured to provide specific information about the operating condition and the threshold that is satisfied by the operating condition, and storing the plurality of descriptor bits in the second array of nonvolatile memory. Some examples of the method 800 and apparatuses described herein may further include processes, features, means, or instructions for storing a flag bit in the second array of nonvolatile memory to indicate that the threshold is satisfied based on determining that the operating condition satisfies the threshold, where the indication of the operating condition includes the flag bit.

Some examples of the method 800 and apparatuses described herein may further include processes, features, means, or instructions for applying a voltage to an antifuse to store at least a portion of the indication of the operating condition, where storing the indication of the operating condition in the second array of nonvolatile memory is based on applying the voltage to the antifuse. In some examples of the method 800 and apparatuses described herein, the antifuse may have a first conductivity after applying the voltage that is greater than a second conductivity of the antifuse before applying the voltage.

Some examples of the method 800 and apparatuses described herein may further include processes, features, means, or instructions for determining that the operating condition satisfies the threshold for a duration, where storing the indication is based on the operating condition satisfying the threshold for the duration. In some examples of the method 800 and apparatuses described herein, the operating condition may include an operating voltage of the first array of volatile memory, an operating temperature of the first array of volatile memory, a timing parameter for a command directed to the first array of volatile memory, or a refresh rate of the first array of volatile memory, or a combination thereof.

Some examples of the method 800 and apparatuses described herein may further include processes, features, means, or instructions for detecting a duration that the first array of volatile memory operates in a mode, where determining that the operating condition satisfies the threshold is based on detecting the duration that the first array operates in the mode. In some examples of the method 800 and apparatuses described herein, the mode of the first array of volatile memory may include a stand-by mode, a refresh mode, an idle mode, or an active mode, or a combination thereof.

Some examples of the method 800 and apparatuses described herein may further include processes, features, means, or instructions for identifying, using an address component, an address of a storage component of the second array of nonvolatile memory to store the indication, where storing the indication of the operating condition is based on identifying the address of the storage component. Some examples of the method 800 and apparatuses described herein may further include processes, features, means, or instructions for incrementing the address of the storage component stored in the address component after storing the indication in the second array. Some examples of the method 800 and apparatuses described herein may further include processes, features, means, or instructions for performing an initialization procedure that identifies a last known address for storing indications of operating conditions in the second array of nonvolatile memory and identifying an address of a storage component of the second array of nonvolatile memory based on performing the initialization procedure.

Figure 9:
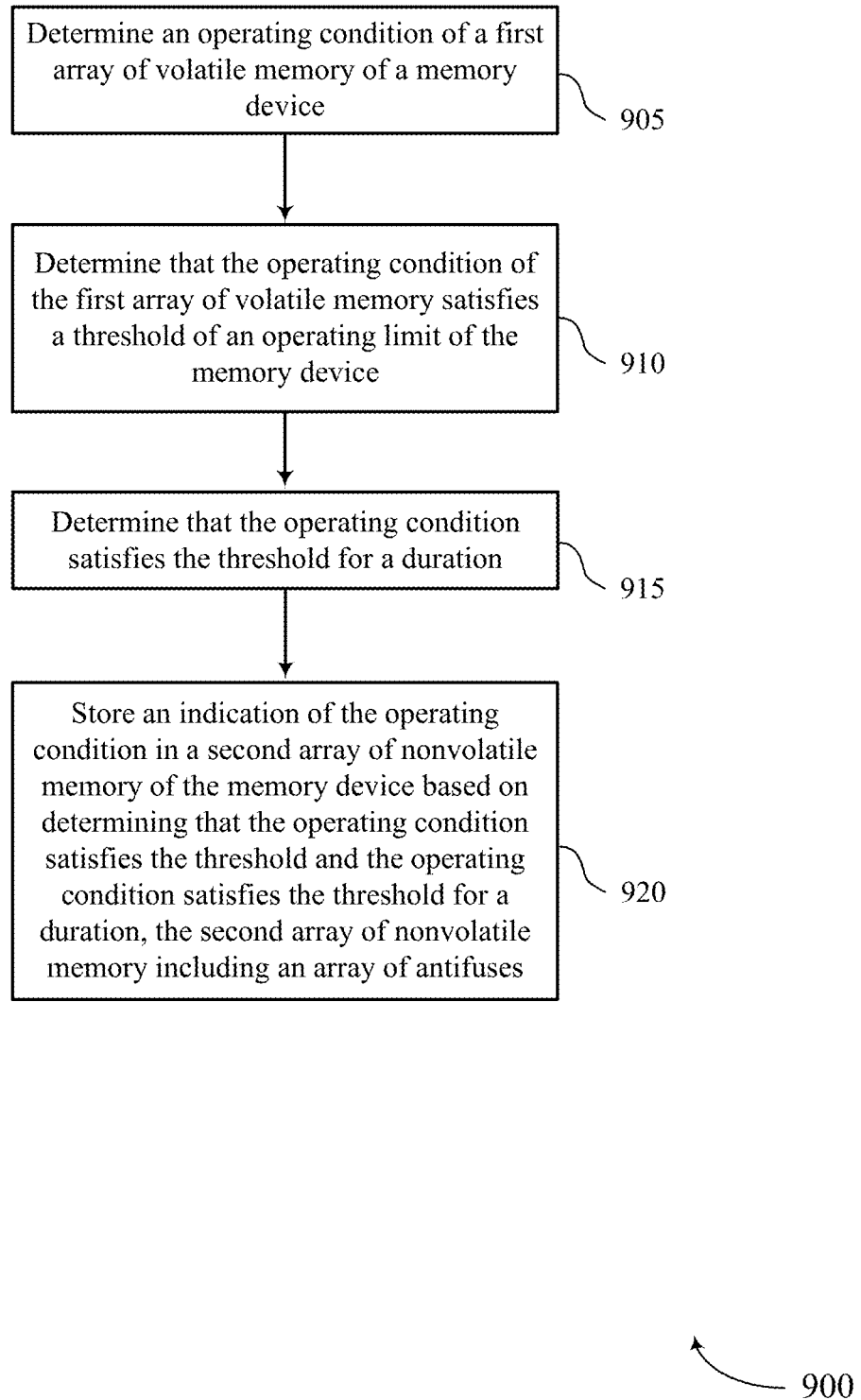

FIG. 9 shows a flowchart illustrating a method 900 that supports techniques using nonvolatile memory and volatile memory in accordance with aspects of the present disclosure. The operations of method 900 may be implemented by a controller or its components as described herein. For example, the operations of method 900 may be performed by a controller (e.g., the device memory controller 155, the local memory controller 165, the local memory controller 260, the controller 320, as described with reference to FIGS. 1 through 3). In some examples, a controller may execute a set of instructions to control the functional elements of the memory array to perform the functions described below. Additionally or alternatively, a controller may perform aspects of the functions described below using special-purpose hardware.

At 905 the controller may determine an operating condition of a first array of volatile memory of a memory device. The operations of 905 may be performed according to the methods described herein. In some examples, aspects of the operations of 905 may be performed by the operating condition component 710 as described with reference to FIG. 7.

At 910 the controller may determine that the operating condition of the first array of volatile memory satisfies a threshold of an operating limit of the memory device. The operations of 910 may be performed according to the methods described herein. In some examples, aspects of the operations of 910 may be performed by the operating condition component 710 as described with reference to FIG. 7.

At 915 the controller may determine that the operating condition satisfies the threshold for a duration. The operations of 915 may be performed according to the methods described herein. In some examples, aspects of the operations of 915 may be performed by the operating condition component 710 as described with reference to FIG. 7.

At 920 the controller may store an indication of the operating condition in a second array of nonvolatile memory of the memory device based on determining that the operating condition satisfies the threshold and the operating condition satisfies the threshold for a duration, the second array of nonvolatile memory including an array of antifuses. The operations of 920 may be performed according to the methods described herein. In some examples, aspects of the operations of 920 may be performed by the programming component 715 as described with reference to FIG. 7.

An apparatus for performing a method or methods, such as the method 900, is described. The apparatus may include means for determining an operating condition of a first array of volatile memory of a memory device, means for determining that the operating condition of the first array of volatile memory satisfies a threshold of an operating limit of the memory device, means for determining that the operating condition satisfies the threshold for a duration, and means for storing an indication of the operating condition in a second array of nonvolatile memory of the memory device based on determining that the operating condition satisfies the threshold and the operating condition satisfies the threshold for a duration, the second array of nonvolatile memory including an array of antifuses.

Another apparatus for performing a method or methods, such as the method 900, is described. The apparatus may include one or more memory arrays and a local memory controller in electronic communication with the one or more memory arrays, where the local memory controller may be operable to determine an operating condition of a first array of volatile memory of a memory device, determine that the operating condition of the first array of volatile memory satisfies a threshold of an operating limit of the memory device, determine that the operating condition satisfies the threshold for a duration, and store an indication of the operating condition in a second array of nonvolatile memory of the memory device based on determining that the operating condition satisfies the threshold and the operating condition satisfies the threshold for a duration, the second array of nonvolatile memory including an array of antifuses.

Figure 10:
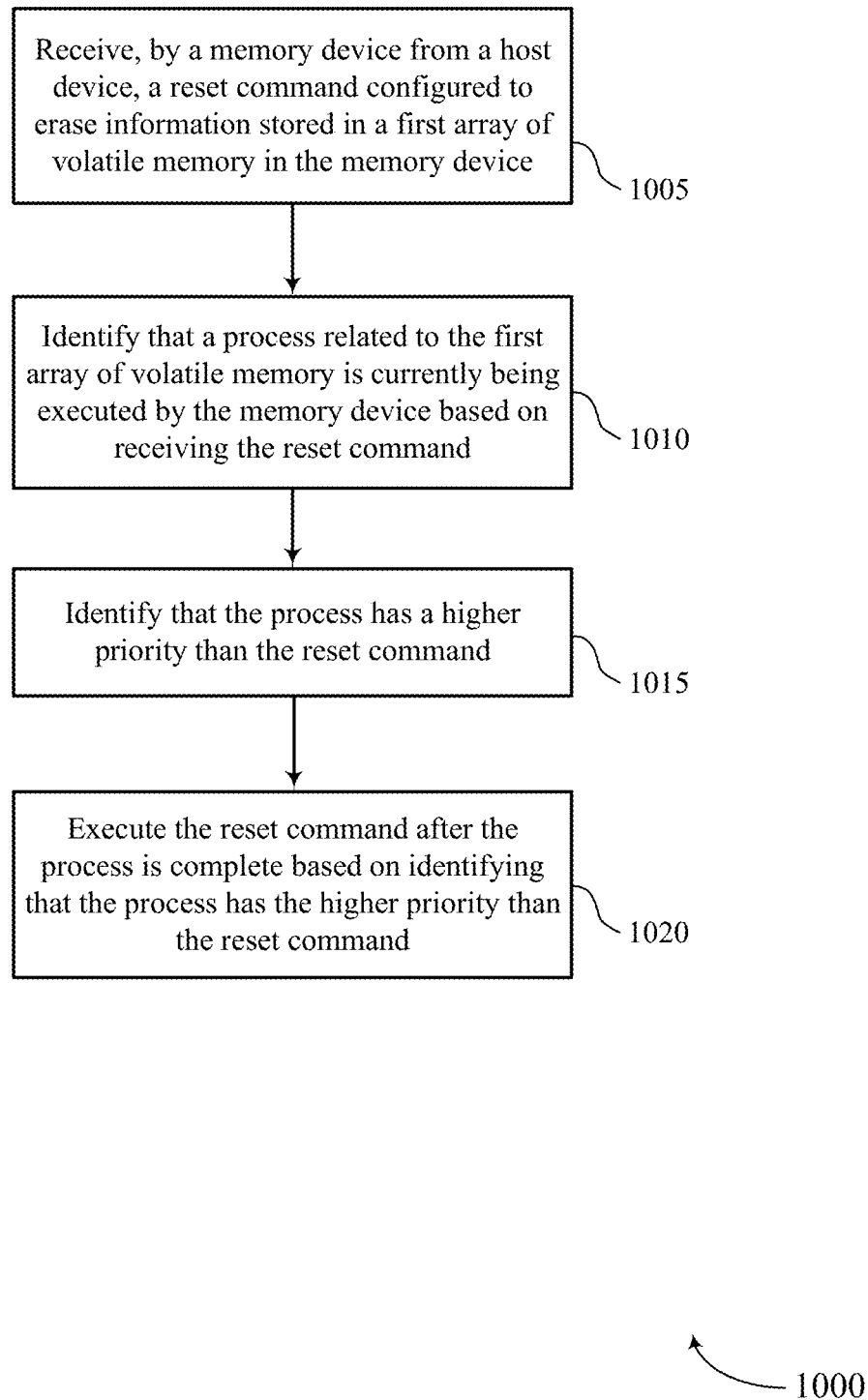

FIG. 10 shows a flowchart illustrating a method 1000 that supports techniques using nonvolatile memory and volatile memory in accordance with aspects of the present disclosure. The operations of method 1000 may be implemented by a controller or its components as described herein. For example, the operations of method 1000 may be performed by a controller (e.g., the device memory controller 155, the local memory controller 165, the local memory controller 260, the controller 320, as described with reference to FIGS. 1 through 3). In some examples, a controller may execute a set of instructions to control the functional elements of the memory array to perform the functions described below. Additionally or alternatively, a controller may perform aspects of the functions described below using special-purpose hardware.

At 1005 the controller of a memory device may receive, from a host device, a reset command configured to erase information stored in a first array of volatile memory in the memory device. The operations of 1005 may be performed according to the methods described herein. In some examples, aspects of the operations of 1005 may be performed by the interface component 735 as described with reference to FIG. 7.

At 1010 the controller may identify that a process related to the first array of volatile memory is currently being executed by the memory device based on receiving the reset command. The operations of 1010 may be performed according to the methods described herein. In some examples, aspects of the operations of 1010 may be performed by the process identification component 740 as described with reference to FIG. 7.

At 1015 the controller may identify that the process has a higher priority than the reset command. The operations of 1015 may be performed according to the methods described herein. In some examples, aspects of the operations of 1015 may be performed by the process identification component 740 as described with reference to FIG. 7.

At 1020 the controller may execute the reset command after the process is complete based on identifying that the process has the higher priority than the reset command. The operations of 1020 may be performed according to the methods described herein. In some examples, aspects of the operations of 1020 may be performed by the command execution component 745 as described with reference to FIG. 7.

An apparatus for performing a method or methods, such as the method 1000, is described. The apparatus may include means for receiving, by a memory device from a host device, a reset command configured to erase information stored in a first array of volatile memory in the memory device, means for identifying that a process related to the first array of volatile memory is currently being executed by the memory device based on receiving the reset command, means for identifying that the process has a higher priority than the reset command, and means for executing the reset command after the process is complete based on identifying that the process has the higher priority than the reset command.

Another apparatus for performing a method or methods, such as the method 1000, is described. The apparatus may include one or more memory arrays and a local memory controller in electronic communication with the one or more memory arrays, where the local memory controller may be operable to receive, by a memory device from a host device, a reset command configured to erase information stored in a first array of volatile memory in the memory device, identify that a process related to the first array of volatile memory is currently being executed by the memory device based on receiving the reset command, identify that the process has a higher priority than the reset command, and execute the reset command after the process is complete based on identifying that the process has the higher priority than the reset command.

In some examples of the method 1000 and apparatuses described herein, the process may access a second array of nonvolatile memory of the memory device, the second array of nonvolatile memory configured to store an indication of an operating condition of the first array of volatile memory. In some examples of the method 1000 and apparatuses described herein, the reset command from the host device may be received when the memory device is stalled.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

determining an operating condition of a first array of volatile memory of a memory device;

determining that the operating condition of the first array of volatile memory satisfies a threshold of an operating limit of the memory device;

identifying a flag bit to indicate that the threshold is satisfied and a plurality of descriptor bits configured to provide specific information about the operating condition and the threshold that is satisfied by the operating condition; and storing an indication of the operating condition in a second array of nonvolatile memory of the memory device based at least in part on determining that the operating condition satisfies the threshold, the second array of nonvolatile memory comprising an array of antifuses.

2. The method of claim 1, further comprising:
storing the plurality of descriptor bits in the second array of nonvolatile memory.

3. The method of claim 1, further comprising:
storing the flag bit in the second array of nonvolatile memory based at least in part on determining that the operating condition satisfies the threshold, wherein the indication of the operating condition includes the flag bit.

4. The method of claim 1, further comprising:
applying a voltage to an antifuse to store at least a portion of the indication of the operating condition, wherein storing the indication of the operating condition in the second array of nonvolatile memory is based at least in part on applying the voltage to the antifuse.

5. The method of claim 4, wherein the antifuse has a first conductivity after applying the voltage that is greater than a second conductivity of the antifuse before applying the voltage.

6. The method of claim 1, further comprising:
determining that the operating condition satisfies the threshold for a duration, wherein storing the indication is based at least in part on the operating condition satisfying the threshold for the duration.

7. The method of claim 1, wherein the operating condition comprises an operating voltage of the first array of volatile memory, an operating temperature of the first array of volatile memory, a timing parameter for a command directed to the first array of volatile memory, or a refresh rate of the first array of volatile memory, or a combination thereof.

8. The method of claim 1, further comprising:
detecting a duration that the first array of volatile memory operates in a mode, wherein determining that the operating condition satisfies the threshold is based at least in part on detecting the duration that the first array operates in the mode.

9. The method of claim 8, wherein the mode of the first array of volatile memory comprises a stand-by mode, a refresh mode, an idle mode, or an active mode, or a combination thereof.

10. The method of claim 1, further comprising:
identifying, using an address component, an address of a storage component of the second array of nonvolatile memory to store the indication, wherein storing the indication of the operating condition is based at least in part on identifying the address of the storage component.

11. The method of claim 10, further comprising:
incrementing the address of the storage component stored in the address component after storing the indication in the second array.

12. The method of claim 1, further comprising:
performing an initialization procedure that identifies a last known address for storing indications of operating conditions in the second array of nonvolatile memory; and
identifying an address of a storage component of the second array of nonvolatile memory based at least in part on performing the initialization procedure.

13. A method, comprising:
receiving, by a memory device from a host device, a reset command configured to erase information stored in a first array of volatile memory in the memory device;
identifying that a process related to the first array of volatile memory is currently being executed by the memory device based at least in part on receiving the reset command,
wherein the process comprises storing a flag bit and a plurality of descriptor bits associated with an operating condition of the first array of volatile memory;
identifying that the process has a higher priority than the reset command; and
executing the reset command after the process is complete based at least in part on identifying that the process has the higher priority than the reset command.

14. The method of claim 13, wherein the process accesses a second array of nonvolatile memory of the memory device, the second array of nonvolatile memory configured to store an indication of the operating condition of the first array of volatile memory.

15. The method of claim 13, wherein the reset command from the host device is received when the memory device is stalled.

16. A memory device, comprising:
a first array of volatile memory configured to store data using at least one volatile memory cell;
a circuit configured to determine an operating condition of the first array of volatile memory, determine that the operating condition of the first array of volatile memory satisfies a threshold of an operating limit of the memory device, and identify a flag bit to indicate that the operating condition satisfies the threshold and a plurality of descriptor bits configured to provide specific information about the operating condition and the threshold that is satisfied by the operating condition; and
a second array of nonvolatile memory configured to store an indication that the operating condition of the first array of volatile memory satisfies the threshold of the operating limit of the first array using one or more nonvolatile memory cells.

17. The memory device of claim 16, wherein the first array of volatile memory and the second array of nonvolatile memory are disposed on a single die, and the second array of nonvolatile memory comprises an array of antifuses.

18. The memory device of claim 16, wherein the circuit comprises a logic controller of the memory device, the logic controller coupled with a logic layer associated with the second array of nonvolatile memory.

19. The memory device of claim 16, wherein the circuit comprises:
a voltage detection circuit and the operating condition comprises an operating voltage of the first array of volatile memory; or
a temperature detection circuit and the operating condition comprises an operating temperature of the first array of volatile memory.

20. The memory device of claim 16, wherein the second array of nonvolatile memory comprises an array of antifuses, an array of phase-change memory cells, or an array of ferroelectric memory cells, or a combination thereof.

* * * * *